(12) United States Patent
Yu et al.

(10) Patent No.: US 10,306,805 B2
(45) Date of Patent: May 28, 2019

(54) COOLING MECHANISM OF HIGH MOUNTING FLEXIBILITY

(71) Applicant: ADLINK TECHNOLOGY INC., New Taipei (TW)

(72) Inventors: Hsiu-Ling Yu, New Taipei (TW); Hsuan-Chan Chiang, New Taipei (TW)

(73) Assignee: ADLINK TECHNOLOGY INC., New Taipei (TW)

( * ) Notice: Subject to any disclaimer, the term of this patent is extended or adjusted under 35 U.S.C. 154(b) by 0 days.

(21) Appl. No.: 15/493,721

(22) Filed: Apr. 21, 2017

(65) Prior Publication Data

US 2017/0231117 A1 Aug. 10, 2017

Related U.S. Application Data

(62) Division of application No. 14/675,059, filed on Mar. 31, 2015.

(51) Int. Cl.

| | |
|---|---|
| H05K 7/20 | (2006.01) |
| H01L 23/40 | (2006.01) |
| F28D 15/02 | (2006.01) |
| G06F 1/20 | (2006.01) |
| F28F 1/02 | (2006.01) |
| F28F 3/12 | (2006.01) |
| H05K 1/02 | (2006.01) |
| F28F 9/26 | (2006.01) |

(52) U.S. Cl.
CPC ..... *H05K 7/20336* (2013.01); *F28D 15/0233* (2013.01); *F28D 15/0275* (2013.01); *F28F 1/02* (2013.01); *F28F 3/12* (2013.01); *F28F 9/266* (2013.01); *G06F 1/20* (2013.01); *H01L 23/40* (2013.01); *H05K 1/0203* (2013.01); *H05K 7/20436* (2013.01); *H05K 7/20809* (2013.01); *F28F 2255/02* (2013.01); *F28F 2275/08* (2013.01); *F28F 2275/14* (2013.01)

(58) Field of Classification Search
CPC ............ F28D 2021/0028; F28D 15/04; F28D 15/0233; H01L 23/40
See application file for complete search history.

(56) References Cited

U.S. PATENT DOCUMENTS

| | | | |
|---|---|---|---|
| 7,382,616 B2 * | 6/2008 | Stefanoski | ................ G06F 1/20 165/104.33 |
| 7,885,072 B2 | 2/2011 | Wu et al. | |

(Continued)

*Primary Examiner* — Jon T. Schermerhorn, Jr.
(74) *Attorney, Agent, or Firm* — Muncy, Geissler, Olds & Lowe, P.C.

(57) ABSTRACT

A cooling mechanism of high mounting flexibility includes a heat sink including a heat sink body defining an accommodation portion and position-limit sliding grooves and stop blocks fastened to the heat sink body, heat pipes positioned in the position-limit sliding grooves and stopped against the stop blocks, each heat pipe having a hot interface accommodated in the accommodation portion and an opposing cold interface positioned in one position-limit sliding groove, heat transfer blocks each defining a recessed insertion passage for accommodating the hot interfaces of the heat pipes and an opposing planar contact surface for the contact of a heat source of an external circuit board, and an elastic member elastically positioned between the heat sink and the heat transfer blocks.

5 Claims, 10 Drawing Sheets

(56) References Cited

U.S. PATENT DOCUMENTS

| | | | |
|---|---|---|---|
| 8,004,841 B2* | 8/2011 | Cipolla | F28D 15/0233 165/104.33 |
| 9,429,369 B2* | 8/2016 | Wu | F28D 15/0275 |
| 2009/0223647 A1* | 9/2009 | Alousi | F28D 15/0233 165/80.3 |
| 2011/0141692 A1* | 6/2011 | Bult | H05K 7/1404 361/700 |
| 2011/0249400 A1 | 10/2011 | Watanabe et al. | |
| 2012/0085520 A1 | 4/2012 | Pfaffinger | |
| 2014/0078673 A1* | 3/2014 | Vincent | H05K 7/20336 361/700 |
| 2015/0062820 A1* | 3/2015 | Lam | H01L 23/473 361/700 |

* cited by examiner

COOLING MECHANISM OF HIGH MOUNTING FLEXIBILITY

CROSS-REFERENCE TO RELATED APPLICATIONS

This application is a Divisional of co-pending application Ser. No. 14/675,059 filed on Mar. 31, 2015 for which priority is claimed under 35 U.S.C. § 120, the entire contents of which are hereby incorporated by reference.

BACKGROUND OF THE INVENTION

1. Field of the Invention

The present invention relates to hard disk drive technology and more particularly, to a cooling mechanism of high mounting flexibility, which provides a margin between each heat pipe and each respective position-limit sliding groove that accommodates the respective heat pipe for enabling the hot interfaces of multiple heat pipes to be positioned in one heat transfer block in reversed directions so that the cold interfaces of the heat pipes can be extended to different peripheral sides of the heat sink to enhance the overall heat dissipation efficiency.

2. Description of the Related Art

Following fast development of technology, advanced computers, notebooks and many other electronic products have been continuously created and widely used in every corner of the society. It is the market trend to create electronic products having the characteristics of strong computing capabilities, high operating speed and small size. However, increasing the operating speed of a computer or notebook will lead to an increase in the amount of latent heat produced by the CPU, imaging processor or other active component parts of the motherboard. It is quite important to keep the temperature of the component parts within the optimal range.

It is the normal way to dissipate heat from heat sources of a circuit board by directly attaching a heat sink to the heat sources. Heat sinks with thick cooling fins or different sizes of heat sinks are selectively used to mate with different heat sources having different heights. However, thick cooling fins have a relatively higher thermal resistance. Taking into consideration the characteristics of low thermal resistance, it needs to use different sizes of heat sinks to mate with different heat sources.

This heat transfer medium can be used in a heat sink to reduce thermal resistance. However, the thickness of the applied heat transfer medium affects the thermal resistance. Cooling modules are then developed to effectively reduce the thermal resistance by means of reducing the thickness of heat transfer medium. A conventional cooling module A, as shown in FIG. 10, comprises a heat sink base A1 which defines a plurality of openings A12, a plurality of locating grooves A11 respectively extended from the openings A12 and a plurality of mounting holes A13 respectively disposed at two opposite sides relative to each opening A12, a plurality of heat pipes A2 respectively accommodated in the locating grooves A11, each heat pipe A2 having one end A21 thereof bonded to one end of one respective locating groove A11 and an opposite end thereof extended to one respective opening A12, a plurality of metal blocks A3 fastened to the heat sink base A1 over the openings A12 and respectively abutted against the respective heat pipes A2, and a plurality of spring members A33 stopped between the heat sink base A1 and the metal blocks A3. Each metal block A3 comprises a plurality of mounting through holes A31, and a plurality of screws A32 respectively inserted through the mounting through holes A31 and the spring members A33 and fastened to the respective mounting holes A13 heat sink base A1. Thus, the metal blocks A3 are flexibly supported on the spring members A33 for abutting against respective heat sources in a circuit board of an electronic apparatus to transfer latent heat from the heat sources to the heat pipes A2 for quick dissipation. Subject to the functioning of the spring members A33, the metal blocks A3 can be kept in tight contact with the respective heat sources, reducing the thermal resistance. However, the arrangement of the spring members A33 between the metal blocks A3 and the heat sink base A1 affects the heat transfer efficiency of transferring latent heat from the heat sources to the heat sink base A1. In this design, the spring members A33 are respectively stopped at the four corners of the metal blocks A3 to keep the metal blocks A3 in balance. However, because each heat pipe A2 has one end A21 thereof bonded to one end of one respective locating groove A11 and an opposite end thereof extended to one respective opening A12, thus, the opposite ends of the heat pipes A2 can simply be arranged in one direction in a parallel manner and bonded to the respective metal blocks A3, i.e., the heat pipes A2 cannot be symmetrically arranged at two opposite sides relative to the metal blocks A3 to let the opposite ends thereof be extended to all different peripheral sides of the heat sink base A1, restricting the use of space and limiting the cooling performance. An improvement in this regard is desired.

SUMMARY OF THE INVENTION

The present invention has been accomplished under the circumstances in view. It is therefore one object of the present invention to provide a cooling mechanism of high mounting flexibility, which comprises a heat sink, at least one heat transfer block and at least one elastic member mounted in the heat sink, and a plurality of heat pipes mounted in the heat sink and set between the at least one heat transfer block and the at least one elastic member. The heat sink comprises a heat sink body, which comprises at least one accommodation portion and a plurality of position-limit sliding grooves extended from the at least one accommodation portion for accommodating the heat pipes respectively, and a plurality of stop blocks fastened to the heat sink body to stop the heat pipes in the position-limit sliding grooves. Each heat pipe comprises a hot interface located at one end thereof and accommodated in one accommodation portion, and a cold interface located at an opposite end thereof and positioned in one position-limit sliding groove. The at least one heat transfer block is mounted in the at least one accommodation portion of the heat sink body, each comprising a recessed insertion passage located in one side thereof for accommodating the hot interface of at least one heat pipe and a planar contact surface located at an opposite side thereof for the contact of a heat source of an external circuit board. The at least one elastic member is elastically positioned between the heat sink and the at least one heat transfer block. Further, the width of the position-limit sliding grooves is larger than the outer diameter of the heat pipes. The margin left between the position-limit sliding grooves and the heat pipes allows adjustment of the position of the heat pipes in the respective position-limit sliding grooves in the horizontal direction. The aforesaid structural design allows the hot interfaces of the heat pipes to be arranged in the recessed insertion passages of the heat transfer blocks in a parallel manner and the cold interfaces of the heat pipes to be extended out of the heat transfer blocks to different peripheral sides of the heat sink for quick dissipation of heat.

Preferably, the heat sink body of the heat sink further comprises an opening located in the accommodation portion, and a plurality of the first screw holes spaced around the opening. Further, each heat transfer block comprises a positioning structure. The positioning structure comprises a plurality of second screw holes spaced around the recessed insertion passage thereof. Further, each elastic member comprises at least one elastic mounting lug. Each elastic mounting lug comprises an elongated position-limit slot located in one end thereof and fastened to one respective first screw hole of the heat sink body by a respective screw, and a circular first through hole located in an opposite hole thereof and fastened to one second screw hole of the positioning structure of one heat transfer block. Thus, the heat transfer blocks can be elastically and positively kept in contact with the external heat sources, effectively reducing thermal resistance.

Preferably, each elastic member comprises an abutment shrapnel. The abutment shrapnel comprises a plurality of elastic protruding portions abutted against the heat pipes, and a plurality of circular second through holes spaced around the elastic protruding portions and respectively fastened to one respective second screw hole of the at least one heat transfer block by a respective screw. By means of adjusting the threaded depth of the screws in the respective second screw holes, the pressure of the elastic protruding portions being acted on the heat pipes is relatively adjusted, keeping the heat pipes and the heat transfer blocks in a tight contact relationship, and thus, the cooling mechanism of high mounting flexibility is well assembled.

Preferably, the heat sink body of the heat sink comprises a plurality of recessed positioning grooves located in the accommodation portion. The at least one elastic member comprises a plurality of elastic thermal pads respectively positioned in the recessed positioning grooves of the heat sink to abut against the at least one heat transfer block. Further, metal sheets are respectively set in between a plurality of the heat transfer blocks and the elastic thermal pads and fixedly fastened to the respective heat transfer blocks for quick transfer of heat. Thus, the latent heat produced during the operation of the heat sources can be rapidly transferred through the heat transfer blocks to the heat pipes and through the metal sheets and the elastic thermal pads to the heat sink to enhance the heat dissipation efficiency.

Other advantages and features of the present invention will be fully understood by reference to the following specification in conjunction with the accompanying drawings, in which like reference signs denote like components of structure.

DETAILED DESCRIPTION OF THE PREFERRED EMBODIMENT

Figure 1:
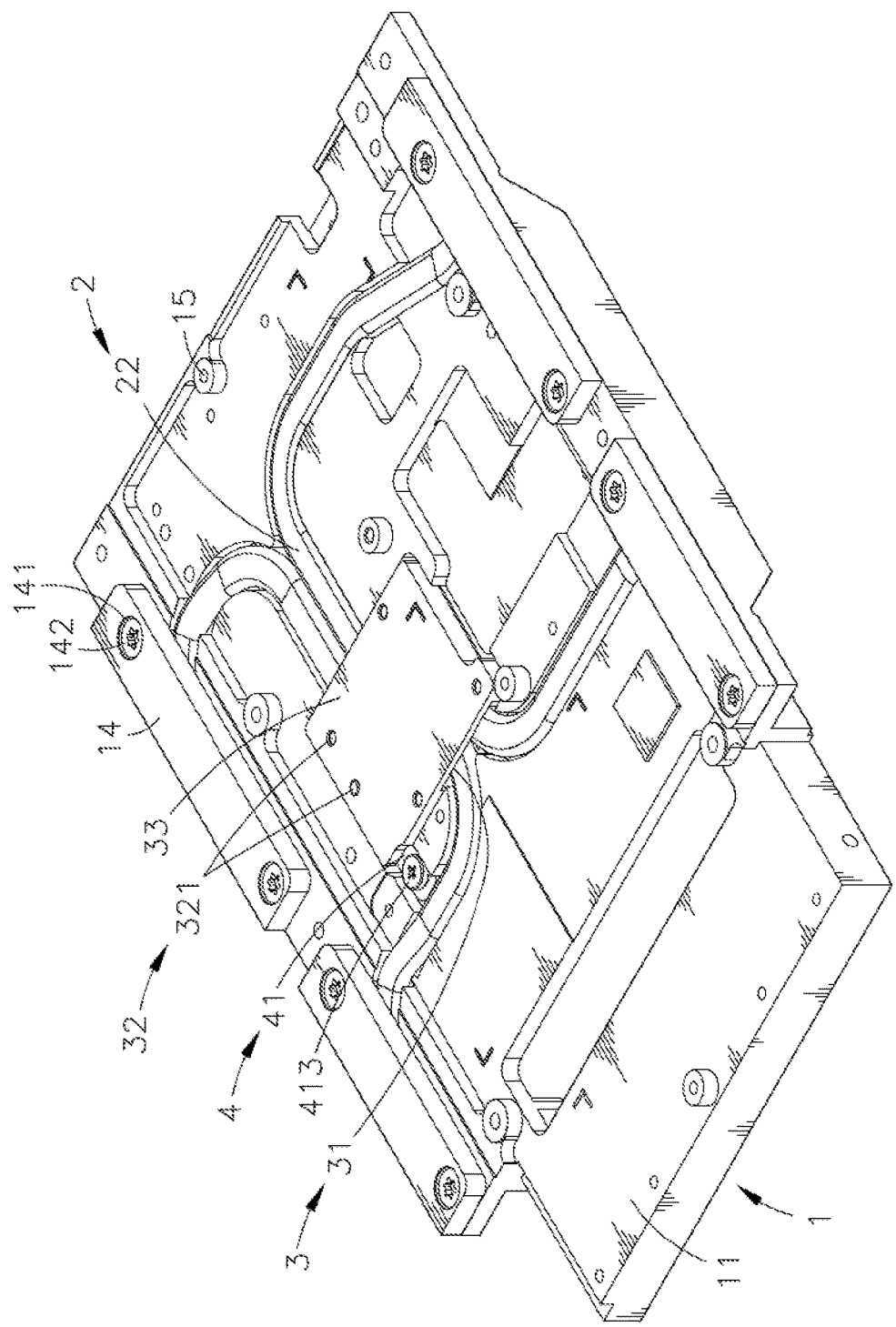
FIG. 1 is an oblique top elevational view of a cooling mechanism of high mounting flexibility in accordance with the present invention.
Figure 2:
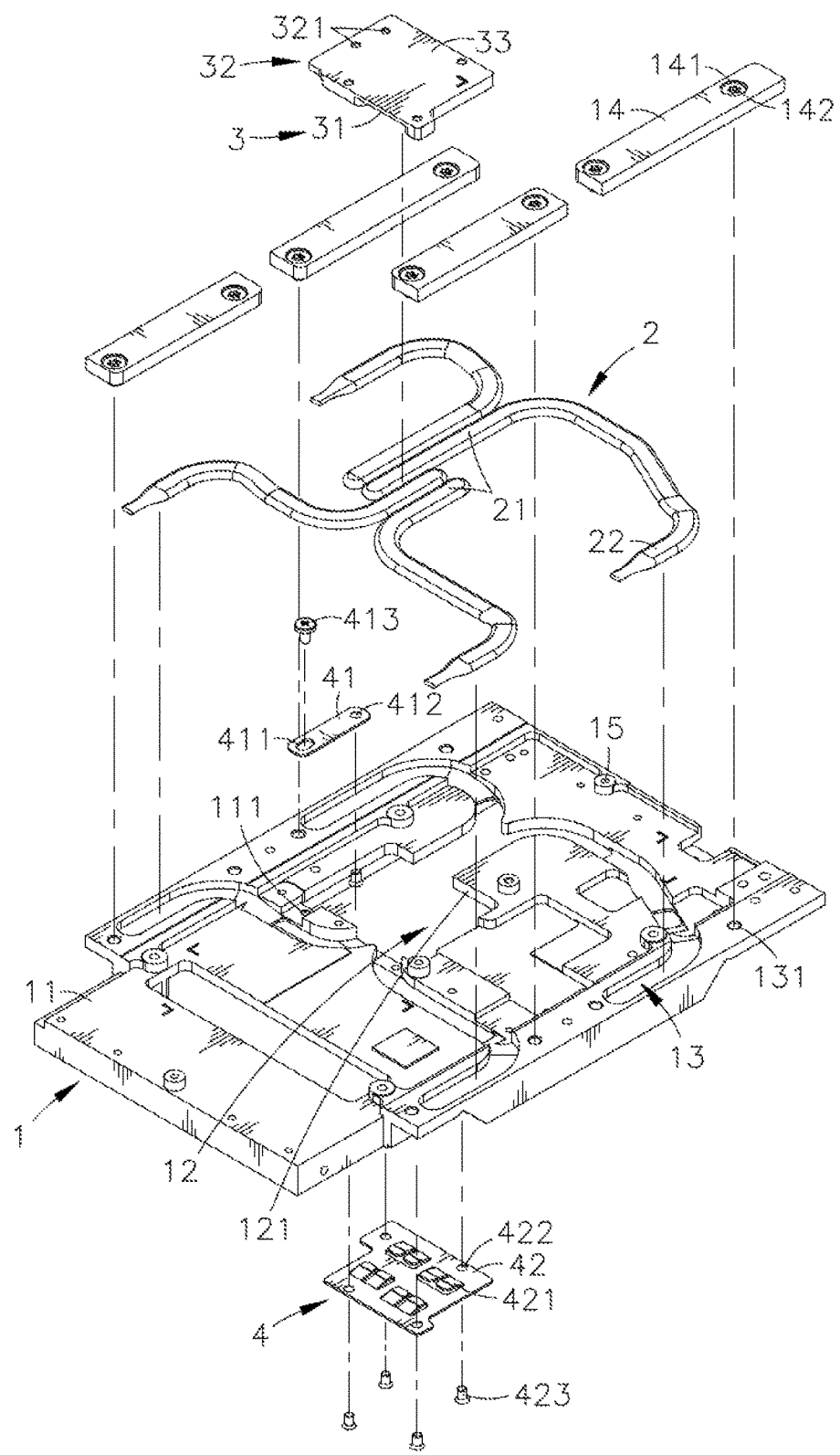
FIG. 2 is an exploded view of the cooling mechanism of high mounting flexibility in accordance with the present invention.
Figure 3:
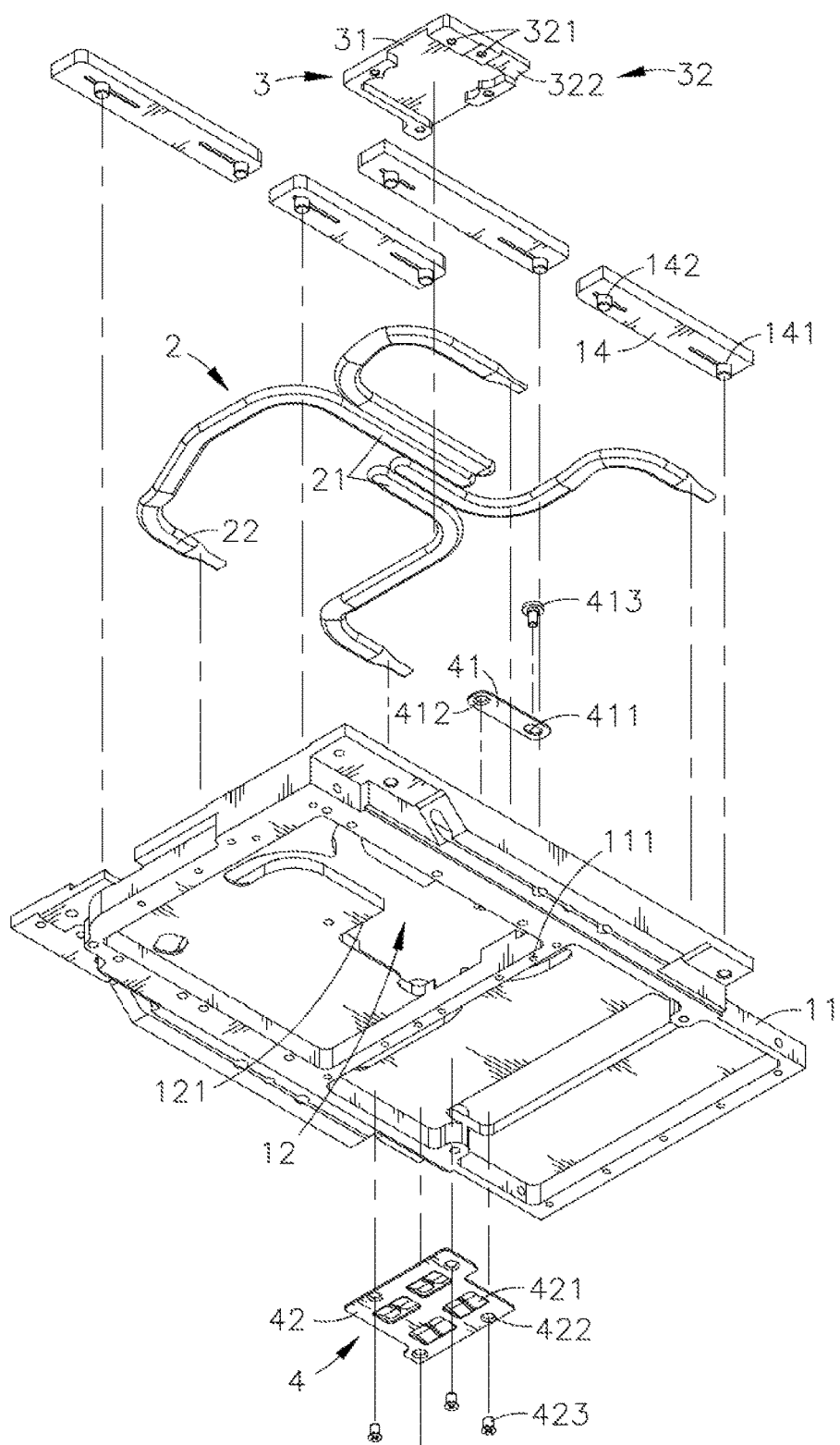
FIG. 3 corresponds to FIG. 2 when viewed in another angle.
Figure 4:
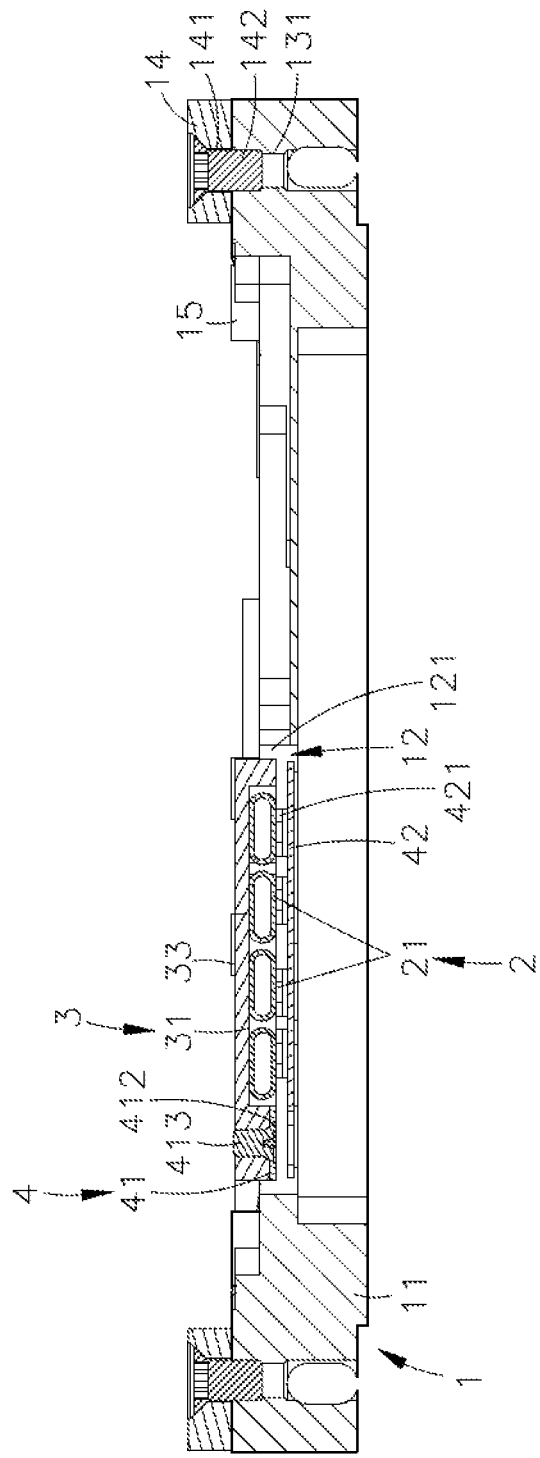
FIG. 4 is a sectional side view of the cooling mechanism of high mounting flexibility in accordance with the present invention.
Figure 5:
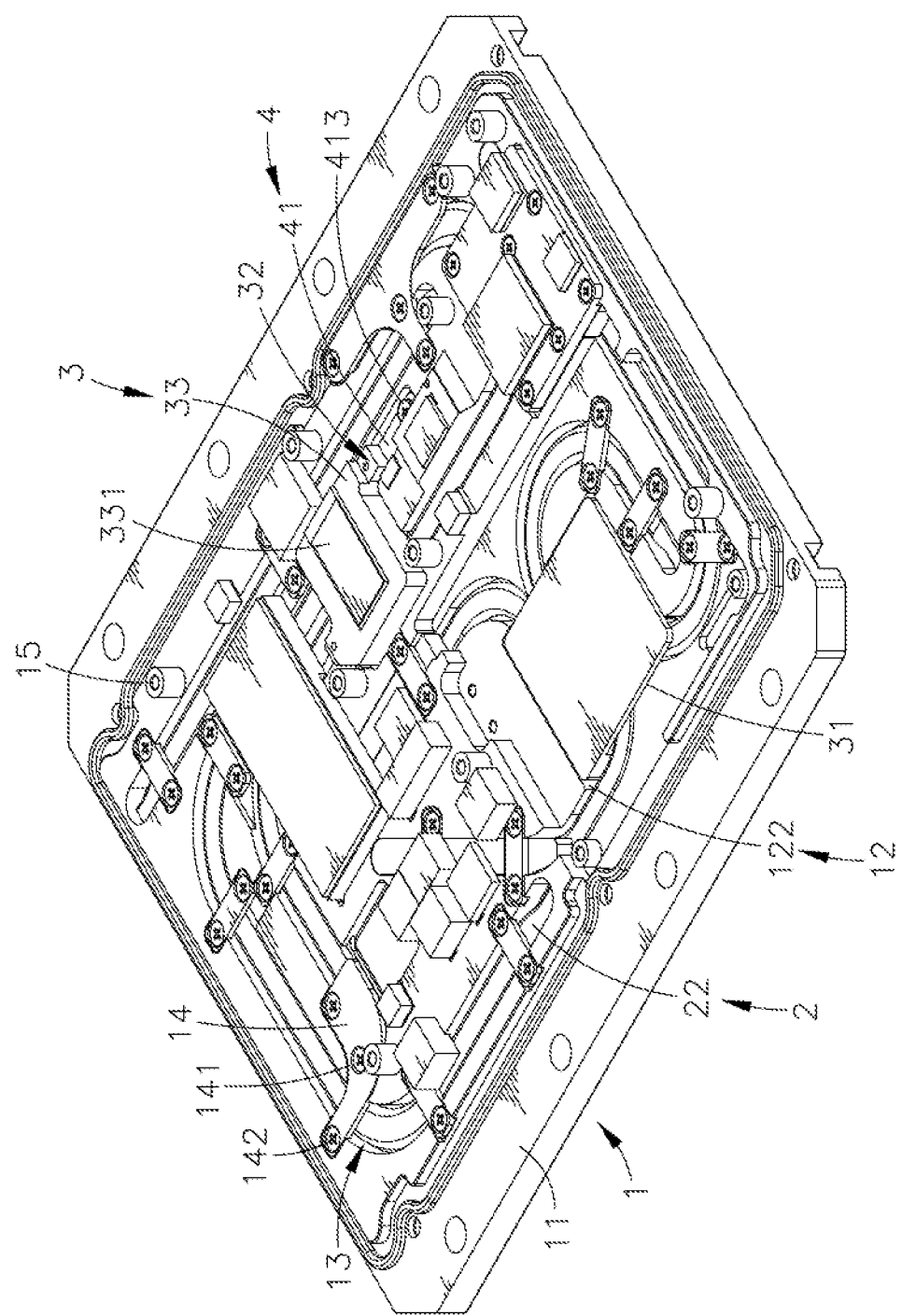
FIG. 5 is an oblique top elevational view of an alternate form of the cooling mechanism of high mounting flexibility in accordance with the present invention.
Figure 6:
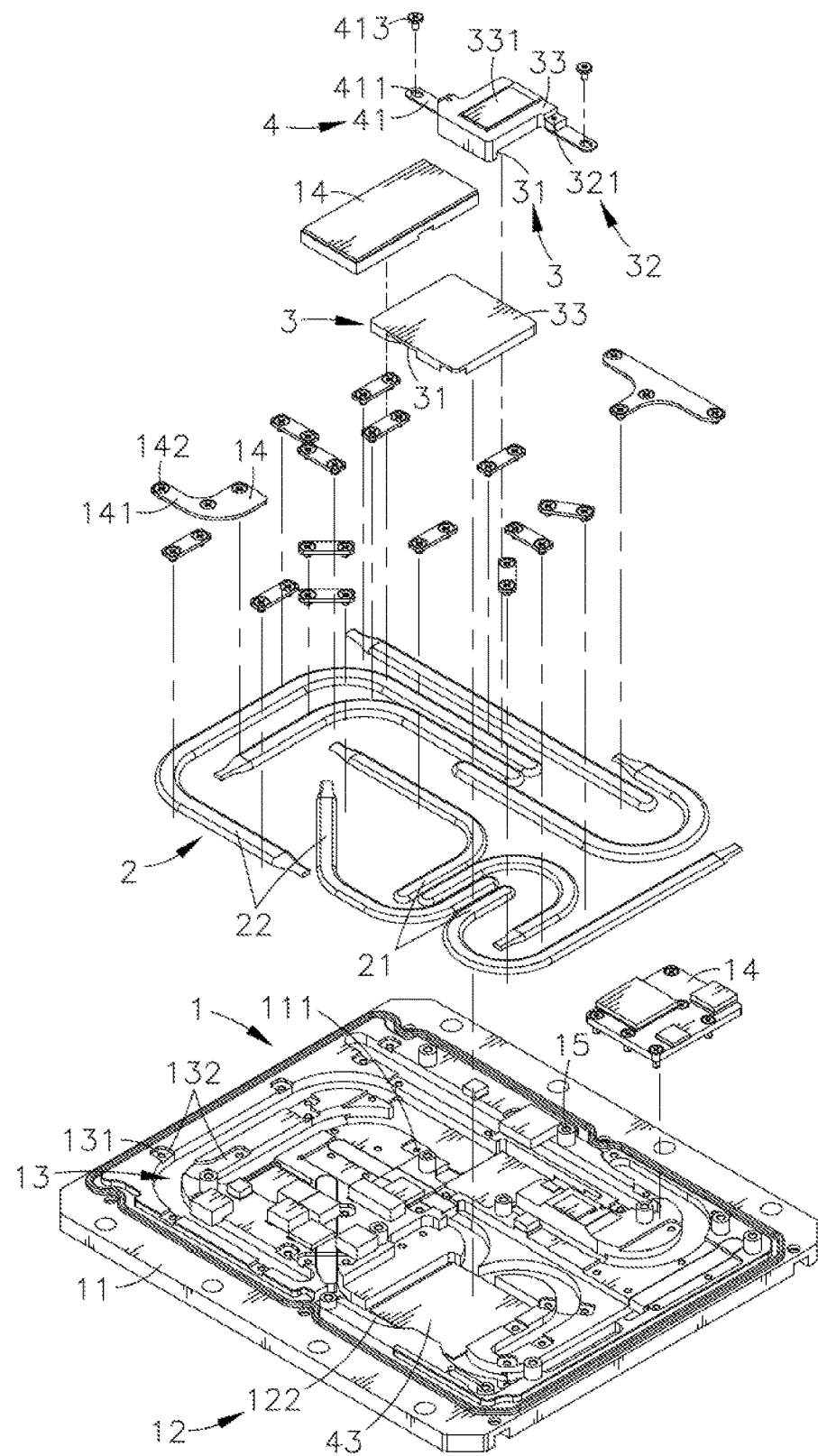
FIG. 6 is an exploded view of the alternate form of the cooling mechanism of high mounting flexibility in accordance with the present invention.
Figure 7:
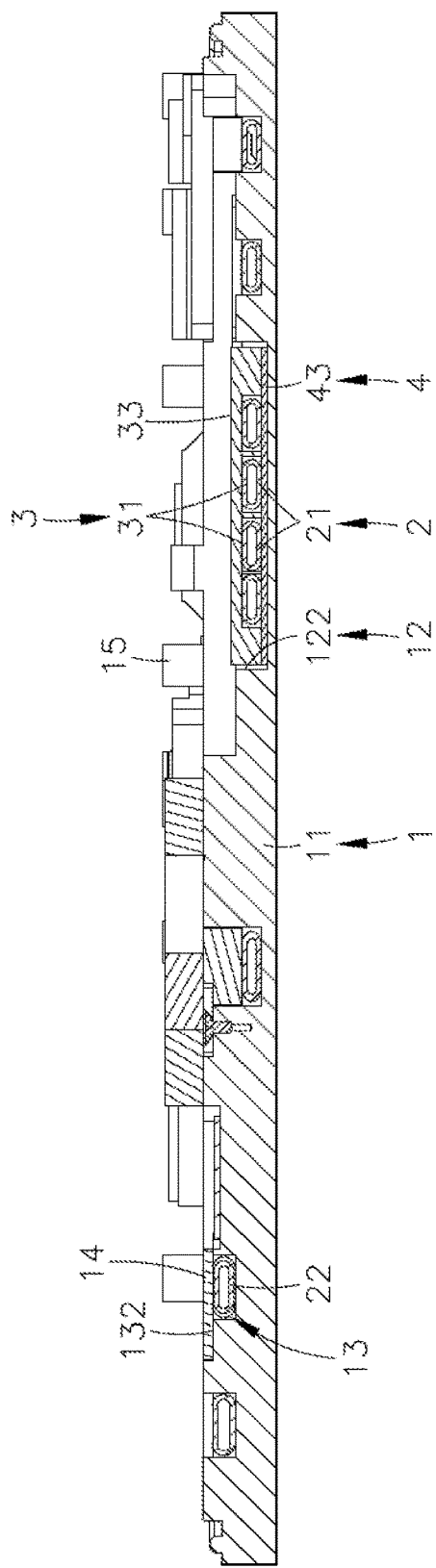
FIG. 7 is a sectional front view of the alternate form of the cooling mechanism of high mounting flexibility in accordance with the present invention.
Figure 8:
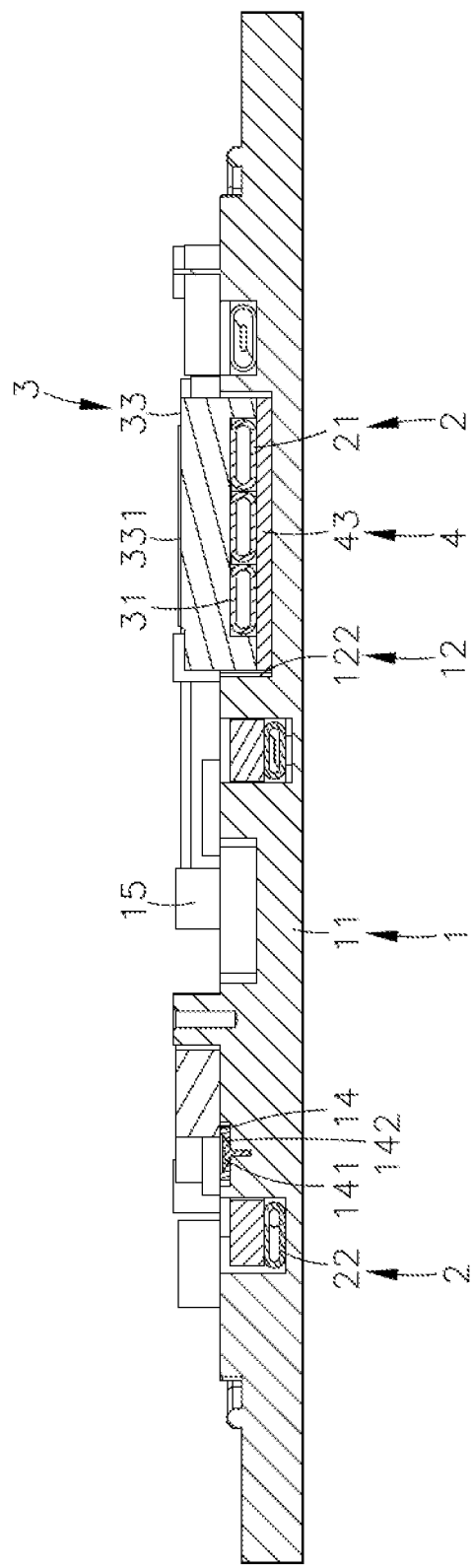
FIG. 8 is a sectional side view of the alternate form of the cooling mechanism of high mounting flexibility in accordance with the present invention.

Referring to FIGS. 1-4, a cooling mechanism of high mounting flexibility in accordance with the present invention is shown. The cooling mechanism of high mounting flexibility comprises a heat sink 1, a plurality of heat pipes 2, at least one heat transfer block 3, and at least one elastic member 4.

The heat sink 1 comprises a heat sink body 11, and a plurality of stop blocks 14. The heat sink body 11 comprises an accommodation portion 12 defined in a top side thereof, an opening 121 located in the accommodation portion 12, a plurality of first screw holes 111 spared around the opening 121, a plurality of position-limit sliding grooves 13 outwardly extended from the accommodation portion 12 to the border area thereof for accommodating the heat pipes 2, a plurality of mounting through holes 131 spaced around each position-limit sliding groove 13, and a plurality of internally threaded columns 15 spaced around the position-limit sliding grooves 13. The stop blocks 14 are mounted on the heat sink body 11 and adapted to stop the heat pipes 2 in the position-limit sliding grooves 13. The stop blocks 14 are preferably made in the form of a cooling block, each comprising a plurality of through holes 141 and a screw 142 mounted in each through hole 141.

The heat pipes 2 in this embodiment are flat pipes to achieve a low-profile design, each having a hot interface 21 for absorbing heat and an opposing cold interface 22 for discharging heat. In actual application, the shape of the heat pipes 2 can be changed to mate with the structural design of the heat sink 1.

Each heat transfer block 3 comprises at least one, for example, one recessed insertion passage 31 located in a bottom side thereof and having two opposite open ends thereof disposed in a dislocated manner, a positioning structure 32 comprising a plurality of second screw holes 321 spaced around the recessed insertion passage 31 and at least one notch 322 respectively disposed adjacent to one respective second screw hole 321, and a planar contact surface 33 located on an opposing top side thereof.

Each elastic member 4 comprises at least one elastic mounting lug 41 and an abutment shrapnel 42. Each elastic mounting lug 41 comprises an elongated position-limit slot 411 located in one end thereof, a circular first through hole 412 located in an opposite end thereof, and two screws 413 respectively inserted through the elongated position-limit slot 411 and the circular first through hole 412 in reversed directions. The abutment shrapnel 42 comprises a plurality of elastic protruding portion 421, a plurality of circular second through holes 422 spaced around the elastic protruding portions 421, and a screw 423 mounted in each circular second through hole 422.

When assembling the cooling mechanism of high mounting flexibility, put the heat pipes 2 in the respective position-limit sliding grooves 13 in the heat sink body 11 of the heat sink 1 to suspend the hot interfaces 21 of the heat pipes 2 in the opening 121 in the accommodation portion 12 and to keep the respective cold interfaces 22 in the respective position-limit sliding grooves 13, and then place the stop blocks 14 on the heat sink body 11 around the position-limit sliding grooves 13 over the heat pipes 2, and then thread the screws 142 in the through holes 141 into the respective mounting through holes 131 around the position-limit sliding grooves 13 to affix the stop blocks 14 to the heat sink body 11, holding the heat pipes 2 in the respective position-limit sliding grooves 13. Further, the width of the position-limit sliding grooves 13 is larger than the outer diameter of the heat pipes 2, providing a margin.

Thereafter, aim the elongated position-limit slots 411 of the elastic mounting lugs 41 of the elastic member 4 at the respective first screw holes 111 of the heat sink body 11, and then thread the respective screws 413 in the elongated position-limit slots 411 into the respective first screw holes 111, and then insert the heat transfer block 3 in the opening 121 in the accommodation portion 12 to abut the recessed insertion passage 31 against the hot interfaces 21 of the heat pipes 2 and insert the elastic mounting lug 41 into the notch 322 of the positioning structure 32 and then thread the screw 413 in the circular first through hole 412 into one respective second screw hole 321 of the positioning structure 32 to affix the elastic mounting lug 41 to the heat transfer block 3, and then insert the abutment shrapnel 42 of the elastic member 4 into the opening 121 in the accommodation portion 12 of the heat sink body 11 to abut the elastic protruding portions 421 of the abutment shrapnel 42 against the heat pipes 2, and then thread the screws 423 in the respective circular second through holes 422 into respective second screw holes 321 of the positioning structure 32. Thus, the heat transfer block 3, the elastic member 4 and the heat sink body 11 are fixedly fastened together, securing the hot interfaces 21 of the heat pipes 2 in the recessed insertion passage 31 between the abutment shrapnel 42 and the heat transfer block 3. By means of adjusting the threaded depth of the screws 423 in the respective second screw holes 321, the pressure of the elastic protruding portions 421 being acted on the heat pipes 2 is relatively adjusted, keeping the heat pipes 2 and the heat transfer blocks 3 in a tight contact relationship, and thus, the cooling mechanism of high mounting flexibility is well assembled.

The heat sink 1 can be made from aluminum or copper. Further, the heat pipes 2 can be kept in direct contact with the surfaces of the position-limit sliding grooves 13 of the heat sink 1, or, a thermal paste can be applied to the surface area between the heat pipes 2 and the position-limit sliding grooves 13 of the heat sink 1. Further, the heat transfer block 3 is preferably made from copper. A thermal paste can be applied to the surface area between the recessed insertion passage 31 of the heat transfer block 3 and the heat pipe 2 to fill up the designed-in clearance between the heat pipes 2 and the heat sink 1 or heat transfer block 3 and the gaps in rough, uneven surfaces.

The cooling mechanism of high mounting flexibility can be used to dissipate heat from each heat source such as CPU, GMCH (Graphics and Memory Controller Hub) chip, ICH (I/O Controller Hub) chip or RAM (Random Access Memory) chip in a circuit board (such as motherboard, interface card) of a computer, notebook, server, embedded system or other computer equipment. In application, attach the planar contact surface 33 of each heat transfer block 3 to one respective heat source in the circuit board, and then mount screws in the circuit board and thread these screws into the respective internally threaded columns 15 of the heat sink 1 to affix the cooling mechanism of high mounting flexibility to the circuit board of the computer, notebook, server, embedded system or other computer equipment. Further, in installation, a thermal paste can be applied to the surface area between the planar contact surface 33 of each heat transfer block 3 and each respective heat source in the circuit board of the computer, notebook, server, embedded system or other computer equipment.

When abutting each heat transfer block 3 against one respective heat source of the circuit board of the computer, notebook, server, embedded system or other computer equipment, each heat transfer block 3 is forced to move vertically in direction toward the inner side of the accommodation portion 12 of the heat sink 1 to impart a pressure to the hot interface 21 of the respective heat pipe 2. Subject to the arrangement of the stop blocks 14 to stop the cold interfaces 22 of the heat pipes 2 in the respective position-limit sliding grooves 13, and the positioning of the screw 413 in the elongated position-limit slots 411 of the elastic mounting lugs 41 of the elastic member 4 and the first screw hole 111 of heat sink 1 to support the heat transfer blocks 3, the heat transfer blocks 3 can be automatically flexibly adjusted to keep in positive contact with the respective heat sources of the circuit board of the computer, notebook, server, embedded system or other computer equipment, effectively reducing thermal resistance. The margin left between the position-limit sliding grooves 13 and the heat pipes 2 allows adjustment of the position of the heat pipes 2 in the respective position-limit sliding groove 13 in the horizontal direction. The aforesaid structural design allows the hot interfaces 21 of the heat pipes 2 to be arranged in the recessed insertion passages 31 of the heat transfer blocks 3 in a parallel manner and the cold interfaces 22 of the heat pipes 2 to be extended out of the heat transfer blocks 3 to different peripheral sides of the heat sink 1. When the heat transfer blocks 3 are respectively abutted against the respective heat sources of the circuit board of the computer, notebook, server, embedded system or other computer equipment, the heat pipes 2 can be moved in the respective position-limit sliding grooves 13, keeping the respective heat transfer blocks 3 in positive contact with the respective heat sources of the circuit board of the computer, notebook, server, embedded system or other computer equipment, and thus, the invention effectively reduces the thermal resistance and enhances the overall heat dissipation efficiency.

During operation of each source of the circuit board of the computer, notebook, server, embedded system, or other computer equipment, each respective aluminum or copper heat transfer block 3 absorbs latent heat from the respective heat source and transfers absorbed latent heat to the hot interface 21 of the respective heat pipe 2 directly or through the applied thermal paste, enabling the internal working fluid of each heat pipe 2 to repeatedly cycle phase transition between the hot interface 21 and cold interface 22 thereof through a capillary action or gravity. Further, the stop blocks 14 (for example, cooling blocks) and the aluminum or copper heat sink 1 provide a large area of heat dissipation surface to facilitate rapid and efficient dissipation of latent heat from each heat source of the circuit board of the computer, notebook, server, embedded system or other computer equipment, maintaining normal system functioning.

Referring to FIGS. 5-8, in an alternate form of the present invention, at least one recessed positioning groove 122 is defined in the accommodation portion 12 of the heat sink 1 to substitute for the aforesaid at least one opening 121. In this alternate form, the heat sink 1 further comprises a plurality of locating grooves 132 respectively extended from the position-limit sliding grooves 13 over the mounting through holes 131; the stop blocks 14 are cooling fins respectively fitted into the locating grooves 132 and kept in flush with the surface of the heat sink 1; the screws 142 in the through holes 141 of the cooling fins 14 are respectively threaded into the respective mounting through holes 131 to affix the respective cooling fins 14 to the heat sink 1 in a flush manner, achieving a low profile design.

Further, in this alternate form of the present invention, at least one heat transfer medium 331 (such as cooling fin or thermal paste) is mounted on the planar contact surface 33 of each heat transfer block 3 to effectively reduce the thermal resistance between each heat source of the circuit board of the computer, notebook, server, embedded system or other computer equipment and each respective heat transfer block 3; the elastic members 4 are made in the form of an elastic thermal pad 43 without the aforesaid elastic mounting lug 41 or abutment shrapnel 42, and respectively positioned in the recessed positioning groove 122 of the heat sink 1 to abut against the heat transfer blocks 3. Further, these elastic thermal pads 43 can be silicone, rubber or ceramic-based elastic members adapted to fill up the designed-in clearance between the heat sink 1 and the heat transfer blocks 3 and the gaps in rough, uneven surfaces. When the heat transfer blocks 3 are abutted against respective heat sources of the circuit board of the computer, notebook, server, embedded system, or other computer equipment, the elastic thermal pads 43 provides an elastic supporting force to the heat transfer blocks 3 against the heat sources of the circuit board of the computer, notebook, server, embedded system or other computer equipment, keeping the heat transfer blocks 3 in close contact with the respective heat sources and minimizing the thermal resistance therebetween, and thus, the overall heat dissipation performance of the cooling mechanism of high mounting flexibility is greatly enhanced.

Figure 9:
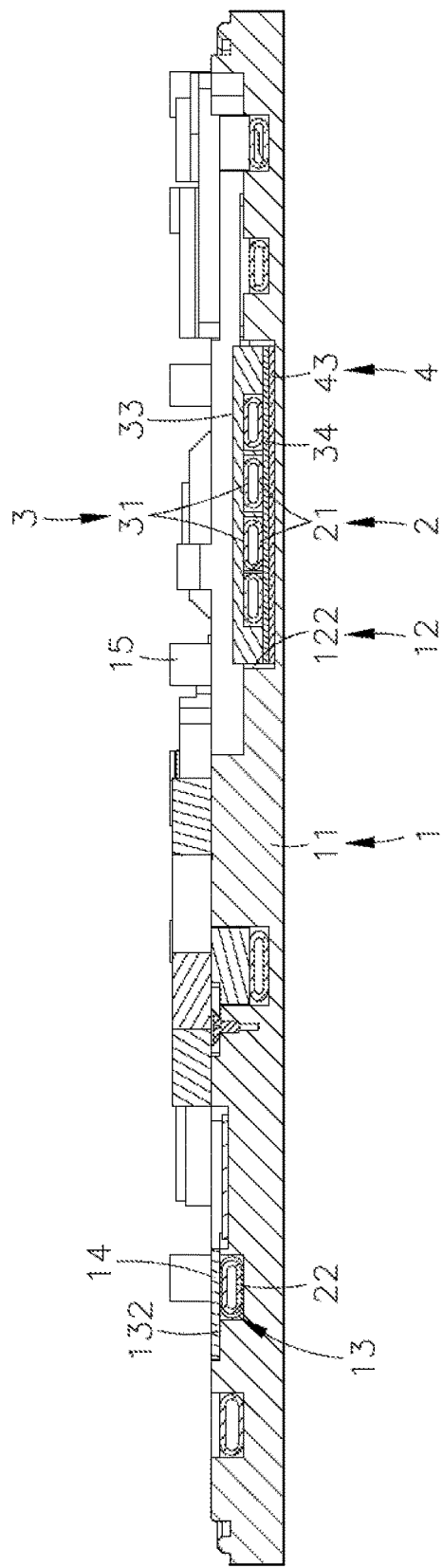
FIG. 9 is a sectional front view of another alternate form of the cooling mechanism of high mounting flexibility in accordance with the present invention.
Figure 10:
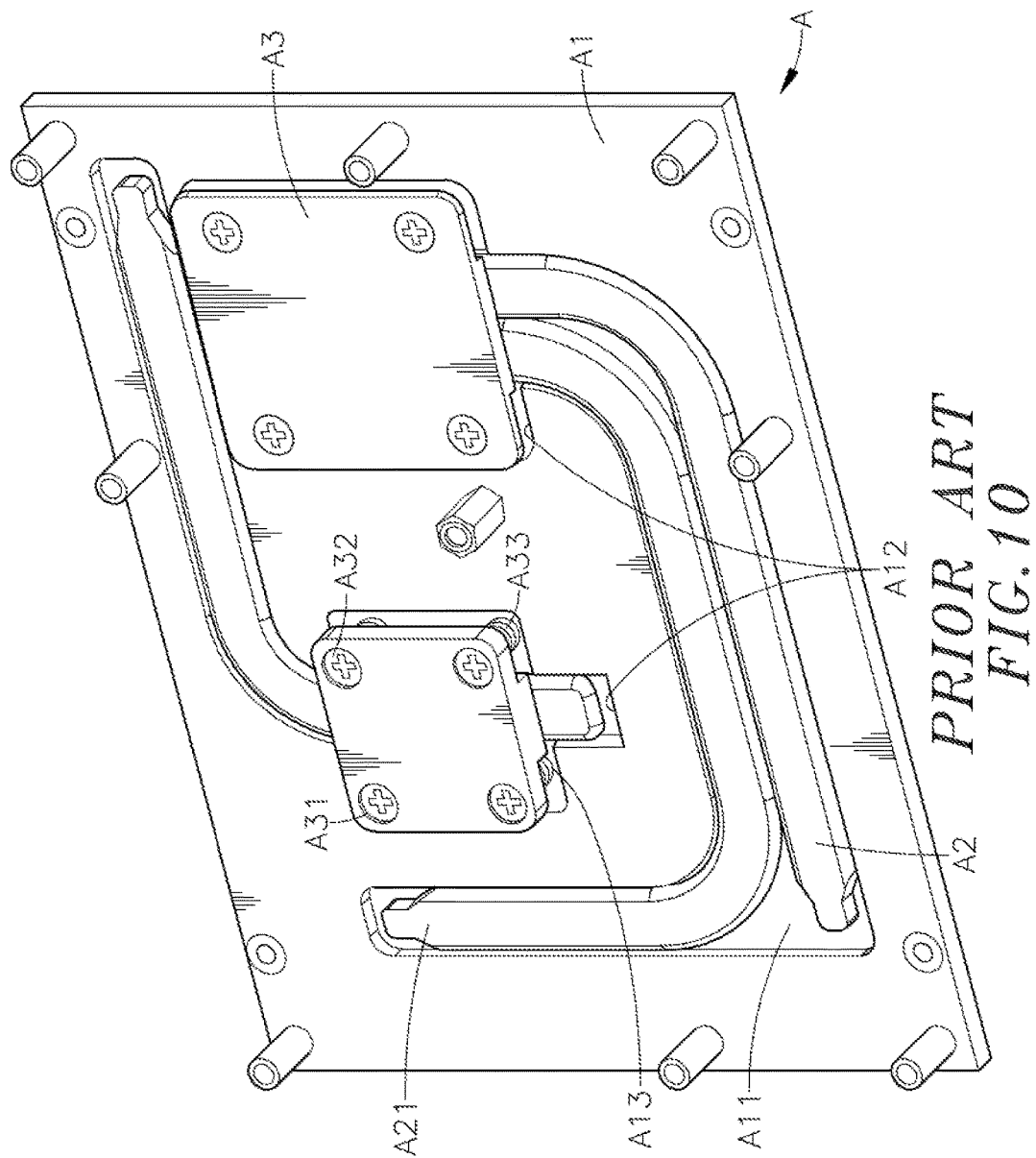
FIG. 10 is an oblique top elevational view of a cooling module according to the prior art.

Further, in another alternate form of the present invention, as shown in FIG. 9, metal sheets 34, for example, aluminum or copper sheet, are respectively set in between the heat transfer blocks 3 and the elastic thermal pads 43 of the elastic members 4, and fixedly fastened to the surface of the respective heat transfer blocks 3 by welding, screw, rivet or thermal adhesive, holding down the hot interfaces 21 of the heat pipes 2 in the recessed insertion passages 31 of the heat transfer blocks 3. Further, a thermal paste can be applied to the surface area between the metal sheets 34 and the heat pipes 2. By means of direct contact between the elastic thermal pads 43 and the metal sheet 34 and between the metal sheets 34 and the heat pipes 2, latent heat can be rapidly transferred from the heat sources of the circuit board of the computer, notebook, server, embedded system or other computer equipment through the heat transfer blocks 3 to the hot interfaces 21 of the heat pipes 2 and through the metal sheets 34 and the elastic thermal pads 43 to the heat sink 1 for quick dissipation.

In conclusion, the invention provides a cooling mechanism of high mounting flexibility, which comprises a heat sink 1, at least one heat transfer block 3 and at least one elastic member 4 mounted in the heat sink 1, and a plurality of heat pipes 2 mounted in the heat sink 1 and set between the at least one heat transfer block 3 and the at least one elastic member 4, wherein the heat sink 1 comprises an accommodation portion 12 defined in the heat sink body 11 thereof, a plurality of position-limit sliding grooves 13 located in the heat sink body 11 and outwardly extended from the accommodation portion 12 for accommodating the heat pipes 2, and a plurality of stop blocks 14 fastened to the heat sink body 11 to stop the heat pipes 2 in the position-limit sliding groove 13; each heat pipe 2 has a hot interface 21 accommodated in the accommodation portion 12 within a recessed insertion passage 31 of the heat transfer block 3, and an opposing cold interface 22 extended to a border area of the heat sink body 11; each elastic member 4 is set between the heat sink 1 and one respective heat transfer block 3 to hold the respective heat pins 2 therebetween; the width of the position-limit sliding grooves 13 is larger than the outer diameter of the heat pipes 2 to provide a margin that allows adjustment of the position of the heat pipes 2 in the respective position-limit sliding groove 13 in the horizontal direction. The aforesaid structural design allows the hot interfaces 21 of the heat pipes 2 to be reversely arranged in the recessed insertion passages 31 of the heat transfer blocks 3 in a parallel manner and the cold interfaces 22 of the heat pipes 2 to be extended out of the heat transfer blocks 3 to different peripheral sides of the heat sink 1 to enhance the heat dissipation efficiency.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A cooling mechanism of high mounting flexibility, comprising a heat sink, at least one heat transfer block and at least one elastic member mounted in said heat sink, and a plurality of heat pipes mounted in said heat sink and set between said at least one heat transfer block and said at least one elastic member, wherein:

said heat sink comprises a heat sink body, said heat sink body comprising at least one accommodation portion and a plurality of position-limit sliding grooves extended from said at least one accommodation portion for accommodating said heat pipes with a margin therebetween to allow adjustment of the position of the heat pipes in the sliding grooves, respectively, a recessed positioning groove located in said at least one accommodation portion, and a plurality of stop blocks fastened to said heat sink body to stop said heat pipes in said position-limit sliding grooves;

each said heat pipe comprises a hot interface located at one end thereof and accommodated in one said accommodation portion, and a cold interface located at an opposite end thereof and positioned in one said position-limit sliding groove;

said at least one heat transfer block is mounted in said at least one accommodation portion of said heat sink body, each said heat transfer block comprising a recessed insertion passage located in one side thereof for accommodating the hot interface of at least one said heat pipe and a planar contact surface located at an opposite side thereof for the contact of a heat source of an external circuit board;

a metal sheet fixedly fastened to said heat transfer block to secure said hot interfaces of said heat pipes in said recessed insertion passage between said metal sheet and said heat transfer block;

said at least one elastic member each comprises an elastic thermal pad respectively positioned in said recessed positioning groove of said heat sink, said elastic thermal pad being elastically positioned to keep in direct contact with said metal sheet;

the metal sheet set in between said heat transfer block and the elastic thermal pad;

each heat transfer block being configured to move vertically toward the inner side of the accommodation portion of the heat sink to impart a pressure to the hot interface of the respective heat pipe, and the stop blocks stop the cold interfaces of the heat pipes in the respective position-limit sliding grooves.

2. The cooling mechanism of high mounting flexibility as claimed in claim 1, wherein the width of said position-limit sliding grooves of said heat sink is larger than the outer diameter of said heat pipes.

3. The cooling mechanism of high mounting flexibility as claimed in claim 1, wherein said heat sink body of said heat sink further comprises a plurality of mounting through hole spaced around said position-limit sliding grooves; each said stop block comprises a plurality of through holes fastened to respective said mounting through holes of said heat sink body of said heat sink by respective screws.

4. The cooling mechanism of high mounting flexibility as claimed in claim 3, wherein said heat sink body of said heat sink further comprises a plurality of locating grooves respectively extended from said position-limit sliding grooves; said mounting through holes are located in said locating grooves; said stop blocks are respectively fitted into said locating grooves and kept in flush with said heat sink body of said heat sink.

5. The cooling mechanism of high mounting flexibility as claimed in claim 1, wherein said heat sink is selectively made from aluminum or copper.

\* \* \* \* \*